(12) United States Patent
Teterwak et al.

(10) Patent No.: US 9,136,864 B1
(45) Date of Patent: Sep. 15, 2015

(54) METHOD FOR TRIMMING SEGMENT CURRENTS IN CURRENT STEERING DAC BASED ON MOST BACK GATE VOLTAGE MODULATION

(71) Applicant: Maxim Integrated Products, Inc., San Jose, CA (US)

(72) Inventors: Jerzy Antoni Teterwak, Colorado Springs, CO (US); Joseph Lutsky, Los Altos, CA (US)

(73) Assignee: MAXIM INTEGRATED PRODUCTS, INC., San Jose, CA (US)

( * ) Notice: Subject to any disclaimer, the term of this patent is extended or adjusted under 35 U.S.C. 154(b) by 0 days.

(21) Appl. No.: 14/619,572

(22) Filed: Feb. 11, 2015

Related U.S. Application Data

(60) Provisional application No. 61/944,887, filed on Feb. 26, 2014.

(51) Int. Cl.
*H03M 1/66* (2006.01)
*H03M 1/74* (2006.01)
*H03M 1/12* (2006.01)
*H03M 1/00* (2006.01)

(52) U.S. Cl.
CPC . *H03M 1/66* (2013.01); *H03M 1/00* (2013.01); *H03M 1/12* (2013.01); *H03M 1/747* (2013.01)

(58) Field of Classification Search
CPC .......... H03M 1/00; H03M 1/12; H03M 1/747
USPC .................. 341/144, 120, 118, 121, 119, 145
See application file for complete search history.

(56) References Cited

U.S. PATENT DOCUMENTS 5,642,116 A * 6/1997 Gersbach ...................... 341/120

* cited by examiner

*Primary Examiner* — Joseph Lauture

(57) ABSTRACT

A digital-to-analog converter (DAC) system includes a DAC and a current trimming module. The DAC includes a plurality of segments and a plurality of drivers. Each of the plurality of segments receives driver signals from a respective one of the plurality of drivers, receives segment currents from a respective one of a plurality of segment current sources, and generates an output current based on the driver signals and the segment currents. The current trimming module stores a plurality of trim coefficients and adjusts respective threshold voltages associated with the plurality of segment current sources based on the plurality of trim coefficients.

14 Claims, 5 Drawing Sheets

METHOD FOR TRIMMING SEGMENT CURRENTS IN CURRENT STEERING DAC BASED ON MOST BACK GATE VOLTAGE MODULATION

CROSS-REFERENCE TO RELATED APPLICATIONS

This application claims the benefit of U.S. Provisional Application No. 61/944,887, filed on Feb. 26, 2014. The entire disclosure of the application referenced above is incorporated herein by reference.

FIELD

The present disclosure relates to linearity trimming in high speed current steering digital-to-analog converters.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Various systems, including, but not limited to, communications systems, implement high speed current steering digital-to-analog converters (DACs). In some communications systems, it is desirable for DAC output signals to have a high spurious free dynamic range (SFDR).

Referring now to FIG. 1, an example DAC 100 includes a plurality of segments 104-1 . . . 104-$n$, referred to collectively as segments 104. Each of the segments 104 includes a respective differential segment switch 108-1, 108-2 . . . 108-$p$, 108-$q$, referred to collectively as segment switches 108. In other words, each of the segments 104 includes a pair of switches (e.g., transistors) 108 corresponding to a differential segment switch. The segment switches 108 steer output currents of the DAC 100 to respective positive output 112 and negative output 116 of the DAC 100. For example, the DAC 100 may include $2^N-1$ of the segment switches 108, where N corresponds to a resolution, in bits, of the DAC 100. In some implementations, a number of the segments 104 may be limited to, for example, 32 or 64 and a resolution of the DAC 100 may be increased by adding additional segmented or binary-weighted sub-DACs.

Each of the segment switches 108 is driven by respective driver signals 120-1, 120-2 . . . 120-$p$, 120-$q$, referred to collectively as driver signals 120, received from segment switch drivers 124-1 . . . 124-$n$, referred to collectively as segment switch drivers 124. The segment switch drivers 124 generate the driver signals 120 based on a clock signal 128 and decoder output data 132-1 . . . 132-$n$, referred to collectively as decoder output data 132. For example only, the decoder output data 132 is driven by a binary to thermometer code decoder (not shown). Current source segments 136-1 . . . 136-$n$, referred to collectively as current source segments 136, provide segment currents $I_1 \ldots I_n$ to the respective segments 104.

Accordingly, the decoder output data 132, which corresponds to a digital input code to be converted to an analog output, is retimed by the clock signal 128 prior to being applied to the segment switches 108 via the driver signals 120. As the input code increases, less current is directed to the negative output 116 while more current is directed to the positive output 112. For differential mode operation, a resulting output current of the DAC 100 corresponds to a difference between respective currents of the positive output 112 and the negative output 116. The differential output operation suppresses even order harmonics and increases output signal power of the DAC 100.

SUMMARY

A digital-to-analog converter (DAC) system includes a DAC and a current trimming module. The DAC includes a plurality of segments and a plurality of drivers. Each of the plurality of segments receives driver signals from a respective one of the plurality of drivers, receives segment currents from a respective one of a plurality of segment current sources, and generates an output current based on the driver signals and the segment currents. The current trimming module stores a plurality of trim coefficients and adjusts respective threshold voltages associated with the plurality of segment current sources based on the plurality of trim coefficients.

A method of operating a digital-to-analog converter (DAC) includes receiving driver signals from a plurality of drivers, receiving segment currents generated by respective ones of a plurality of segment current sources, generating output currents based on the driver signals and the segment currents, storing a plurality of trim coefficients, and adjusting respective threshold voltages associated with the plurality of segment current sources based on the plurality of trim coefficients.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
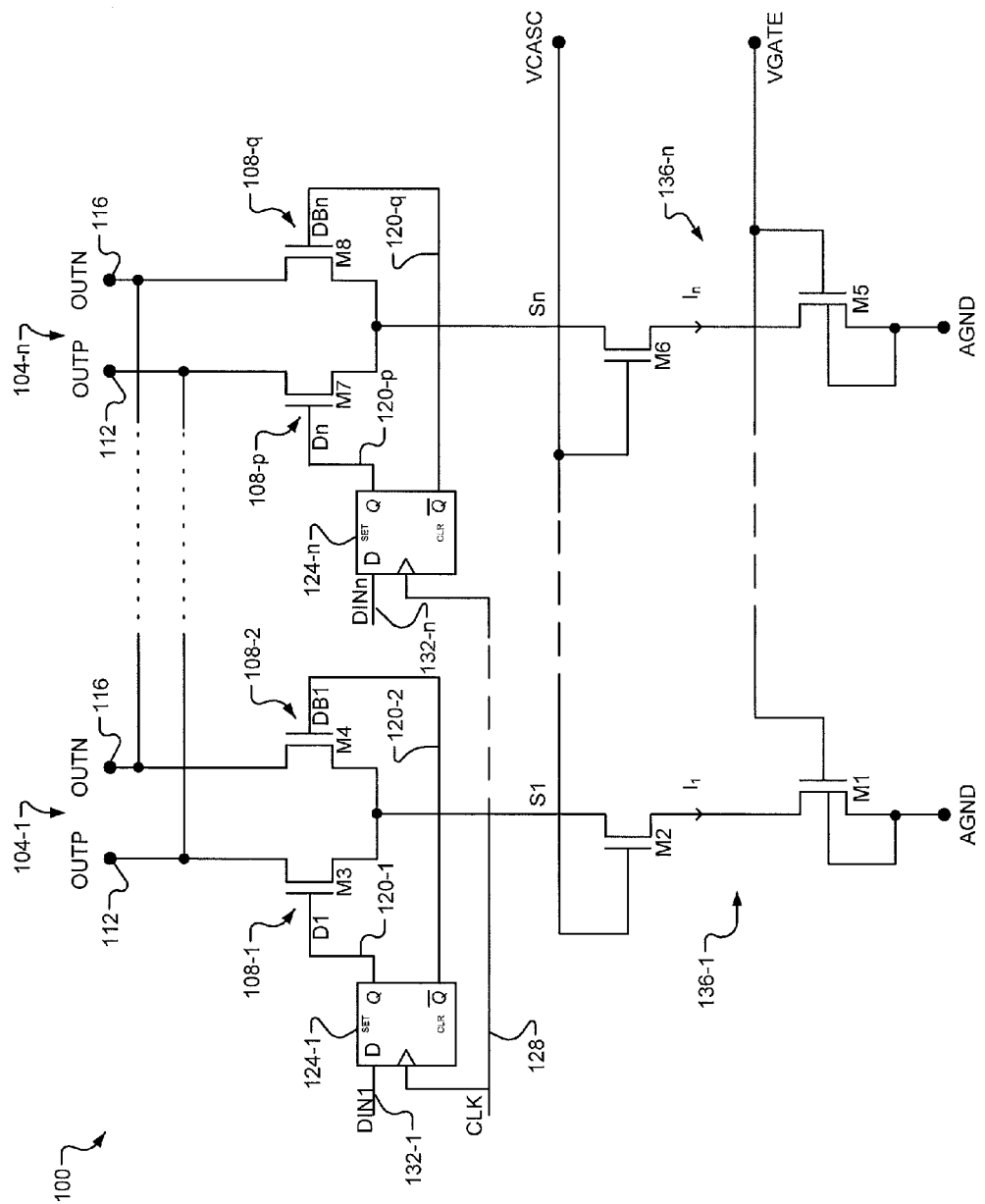
FIG. 1 is an example DAC according to the prior art.

In a digital-to-analog converter (DAC) system (such as a DAC system implementing a high speed current steering DAC), it may be desirable for output signals of the DAC to have a high spurious free dynamic range (SFDR). Static non-linearity (i.e., static linearity errors) of the DAC, including integral nonlinearity (INL) and differential nonlinearity (DNL), may limit the SFDR of the DAC. INL and DNL characteristics of the DAC define a static accuracy of the DAC and may limit dynamic performance of the DAC at high output frequencies. For example, INL errors may result in low order harmonic distortion, while DNL errors may cause a significant spectrum of high order harmonics. Accordingly, minimizing static INL and DNL facilitates achievement of high SFDR in the DAC.

The DAC static nonlinearity typically corresponds to mismatches of segment currents (i.e., segment current mismatch) $I_1, \ldots, I_n$ provided by respective current source transistors (e.g., corresponding to segment current sources) of a DAC current source array. For example, to achieve an INL of ±1LSB in a 14-bit DAC, the segment current mismatch should be less than ±0.05%. In some DACs, this accuracy may be achieved by providing large MOST devices as the segment current sources. However, in a high speed DAC, large current source transistors provide a large capacitance. The large capacitance limits an update rate, and affects dynamic performance, of the DAC.

In other DACs, including some high speed DACs, smaller transistors may be provided as the segment current sources to reduce the capacitance of the current source transistors. In these DACs, segment current matching (i.e., accuracy) may be achieved by trimming the respective segment currents during a production test. For example, the trimming may be performed by connecting small MOS transistors in parallel with the main current source transistors and adjusting the gate voltages of the small MOS transistors. Alternatively, a number of binary weighted trim transistors may be connected in parallel with the main current source transistors. In this manner, a binary coded digital trim value is used to directly control the trim transistors. However, to trim out segment current mismatches to within ±0.05%, the trim transistors are weak and therefore scaling the trim transistors can be difficult. Furthermore, the presence of the trim transistors impacts the regularity and symmetry of the arrangement of the current source array, which negatively affects the initial matching properties of the current source array.

A DAC system according to the principles of the present disclosure includes a current trimming module to trim out threshold voltage differences in current source transistors of the DAC current source array without increasing the size of the current source transistors and without providing additional trim transistors. Instead, the current trimming module adjusts a threshold voltage of the current source transistors. For example, the current trimming module implements MOS transistor (MOST) back gate voltage modulation (i.e., modulation of a back gate voltage of the current source transistors) to trim threshold voltages of the current source transistors such that the respective segment currents generated by the transistors are matched within a required tolerance. Accordingly, by adjusting an effective threshold voltage of the current source transistors, the current trimming module trims static linearity errors in the DAC by eliminating the most significant source of segment current mismatches rather than merely compensating for the threshold voltage differences. Furthermore, directly trimming the threshold voltage results in reduced trim drift over die temperature.

Figure 2:
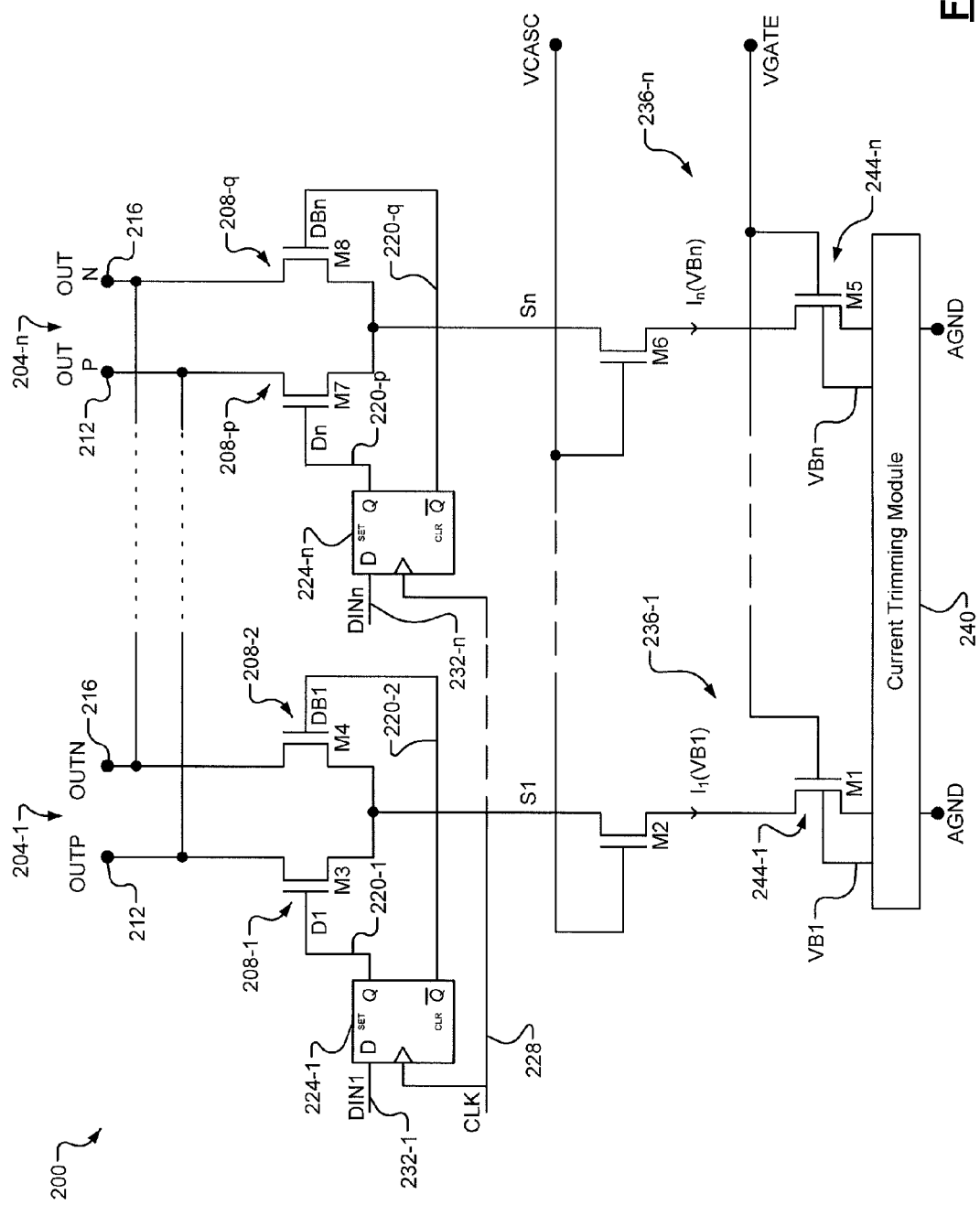
FIG. 2 is an example DAC including a current trimming module according to the principles of the present disclosure.

Referring now to FIG. 2, an example DAC 200 includes a plurality of segments 204-1 . . . 204-n, referred to collectively as segments 204. Each of the segments 204 includes a respective differential segment switch 208-1, 208-2 . . . 208-p, 208-q, referred to collectively as segment switches 208 (where each pair of switches 208-1, 208-2, or 208-p, 208-q, corresponds to a differential segment switch). The segment switches 208 steer output currents of the DAC 200 to respective positive outputs 212 and negative outputs 216 of the DAC 200.

Each of the segment switches 208 is driven by respective driver signals 220-1, 220-2 . . . 220-p, 220-q, referred to collectively as driver signals 220, received from segment switch drivers 224-1 . . . 224-n, referred to collectively as segment switch drivers 224. The segment switch drivers 224 generate the driver signals 220 based on a clock signal 228 and decoder output data 232-1 . . . 232-n, referred to collectively as decoder output data 232.

Current source segments 236-1 . . . 236-n, referred to collectively as current source segments 236, provide segment currents $I_1(VB1) \ldots I_n(VBn)$ to the respective segments 204. A current trimming module 240 provides back gate voltages VB1 . . . VBn to respective current source transistors 244-1 . . . 244-n, referred to collectively as current source transistors 244, to independently modulate the back gate potentials of the current source transistors 244 according to the principles of the present disclosure.

Figure 3:
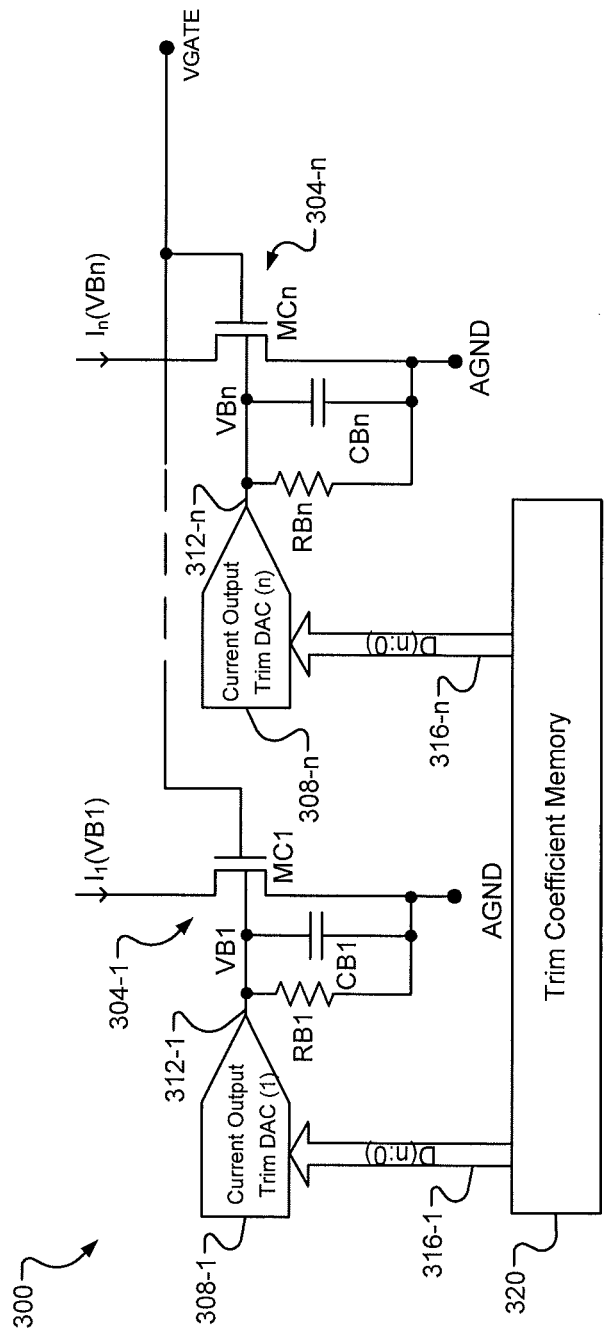
FIG. 3 is an example DAC showing a current trimming module in more detail according to the principles of the present disclosure.

Referring now to FIG. 3, an example current trimming module 300 is shown in more detail. The current trimming module 300 provides the back gate voltages VB1 . . . VBN, referred to collectively as back gate voltages VB, to modulate the back gate potentials of respective current source transistors 304-1 . . . 304-n, referred to collectively as current source transistors 304, to match segment currents $I1(VB1) \ldots In(VBn)$ provided by the current source transistors 304. For example, the current trimming module 300 includes current output trim DACs 308-1 . . . 308-n, referred to collectively as current output trim DACs 308, that each provide a respective output current 312-1 . . . 312-n, referred to collectively as output currents 312, to independently adjust the back gate potentials of the individual current source transistors 304.

For example, the current output trim DACs 308 each have a current output configuration, and provide the respective output currents 312 based on digital trim coefficients 316-1 . . . 316-n, referred to collectively as trim coefficients 316. The current output trim DACs 308 force the output currents 312 through respective resistors RB1 . . . RBn, referred to collectively as resistors RB, causing voltage drops across the resistors RB. The voltage drops across the resistors RB generate the back gate voltages VB, thereby modulating the back gate potentials of the current source transistors 304. Capacitors CB1 . . . CBn, referred to collectively as capacitors CB, reduce noise and improve the power supply rejection ratio (PSRR) associated with the current trimming module 300. Resistance values of each of the resistors RB may be the same. Similarly, capacitance values of each of the capacitors CB may be the same.

A resolution of each of the output trim DACs 308 may be based on a ratio between a desired trim range (e.g., a desired range of the back gate voltages VB) and a desired trim precision (e.g., a desired tuning precision of the back gate voltages VB). For example only, the digital trim coefficients 316 may have a resolution of 5 bits, providing a range of 32 values of the output currents 312. In other implementations, the digital trim coefficients 316 may have 6, 7, or more bits based on the desired trim range and precision. The digital trim coefficients 316 may be stored in a non-volatile trim coefficient memory 320. The trim coefficient memory 320 may be located on a same chip with the current trimming module 300 and/or the DAC that includes the current trimming module 300. The values of the digital trim coefficients 316 may be programmed into the trim coefficient memory 320 during production testing of the DAC, and/or may be adjusted/calibrated in the field and/or by the customer.

Figure 4:
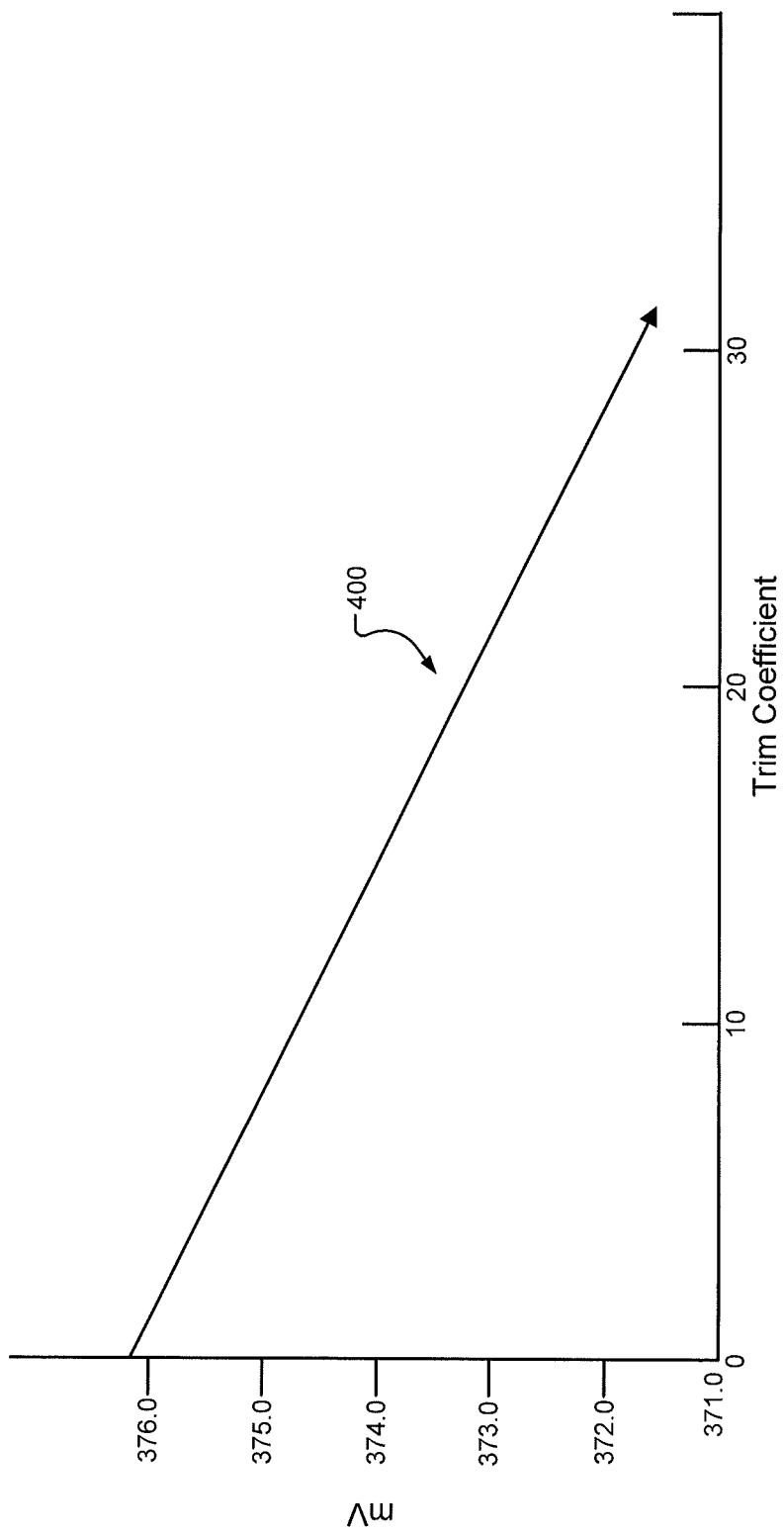
FIG. 4 illustrates current source transistor threshold voltage as a function of a trim DAC input code (i.e., a trim coefficient) according to the principles of the present disclosure.

Referring now to FIG. 4, an example current source transistor threshold voltage 400 as a function of the digital trim coefficients is shown. As shown, a resolution of the corresponding output trim DACs is 5-bit (i.e., the digital trim coefficients are 5 bits, providing values from 0 to 31). As the trim coefficient increases from 0 to 31, the corresponding back gate voltage is modulated between 0 and 35 mV. As a result, the current source transistor threshold voltage decreases from approximately 376.1 mV at a trim coefficient of 0 to approximately 371.6 mV at a trim coefficient of 31. In other words, the current source transistor threshold voltage decreases from approximately 376.1 mV to approximately 371.6 mV as the back gate voltage increases from 0 to 35 mV.

Figure 5:
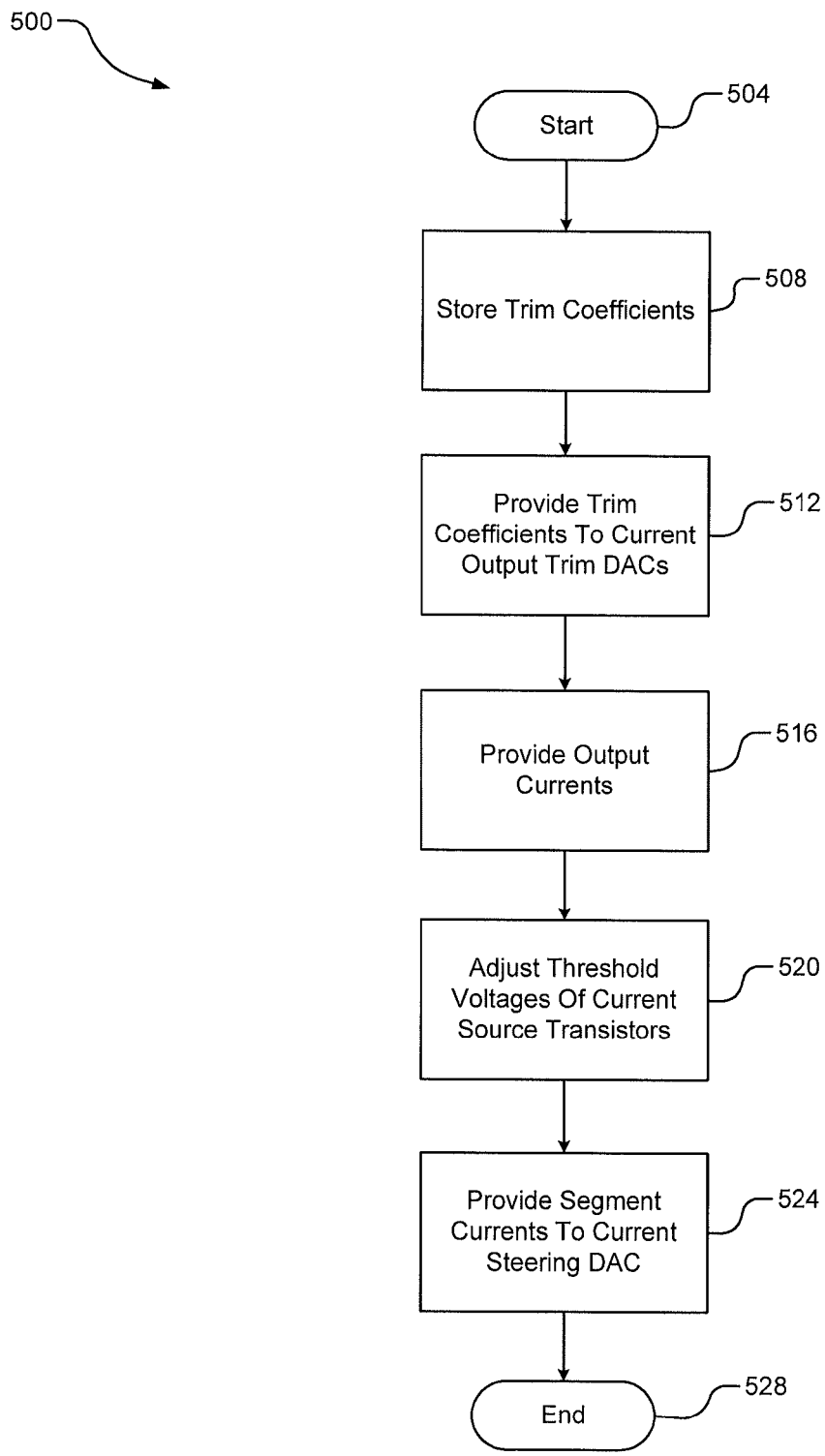
FIG. 5 illustrates steps of an example method of trimming segment currents in a current steering DAC according to the principles of the present disclosure.

Referring now to FIG. 5, a method 500 of trimming segment currents in a current steering DAC according to the principles of the present disclosure begins at 504. At 508, the method 500 stores a plurality of trim coefficients. For example, the trim coefficients are digital values stored in non-volatile memory. At 512, the method 500 provides the trim coefficients to respective current output trim DACs. At 516, the current output trim DACs provide, based on the plurality of trim coefficients, respective output currents. At 520, the method 500 adjusts, based on the output currents, back gate voltages of respective current source transistors to adjust threshold voltages of the current source transistors. At 524, the current source transistors provide segment currents to the current steering DAC based on the adjusted back gate voltages. The method 500 ends at 528.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. As used herein, the phrase at least one of A, B, and C should be construed to mean a logical (A OR B OR C), using a non-exclusive logical OR, and should not be construed to mean "at least one of A, at least one of B, and at least one of C." It should be understood that one or more steps within a method may be executed in different order (or concurrently) without altering the principles of the present disclosure.

In this application, including the definitions below, the term 'module' or the term 'controller' may be replaced with the term 'circuit.' The term 'module' may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A digital-to-analog converter (DAC) system comprising:
   a DAC including a plurality of segments and a plurality of drivers, wherein each of the plurality of segments
      receives driver signals from a respective one of the plurality of drivers,
      receives a segment current generated by a respective one of a plurality of segment current sources, and
      generates an output current based on the driver signals and the segment currents; and
   a current trimming module that stores a plurality of trim coefficients and adjusts respective threshold voltages associated with the plurality of segment current sources based on the plurality of trim coefficients.

2. The DAC system of claim 1, wherein the segment current sources include respective current source transistors, and wherein the threshold voltages correspond to respective back gate voltages of the current source transistors.

3. The DAC system of claim 1, wherein the current trimming module adjusts the respective threshold voltages to match the segment currents generated by the plurality of segment current sources.

4. The DAC system of claim 1, wherein the current trimming module independently adjusts the respective threshold voltages.

5. The DAC system of claim 1, wherein each of the segment current sources includes a resistor, and wherein the current trimming module adjusts the respective threshold voltages based at least in part on the resistors.

6. The DAC system of claim 1, wherein the current trimming module includes a plurality of current output trim DACs, wherein each of the plurality of current output trim DACs receives a respective one of the plurality of trim coefficients and generates a back gate voltage based on the respective one of the plurality of trim coefficients.

7. The DAC system of claim 6, wherein the current trimming module adjusts the respective threshold voltages based on the back gate voltages.

8. A method of operating a digital-to-analog converter (DAC), the method comprising:
   receiving driver signals from a plurality of drivers;
   receiving segment currents generated by respective ones of a plurality of segment current sources;
   generating output currents based on the driver signals and the segment currents;
   storing a plurality of trim coefficients; and
   adjusting respective threshold voltages associated with the plurality of segment current sources based on the plurality of trim coefficients.

9. The method of claim 8, wherein the segment current sources include respective current source transistors, and wherein the threshold voltages correspond to respective back gate voltages of the current source transistors.

10. The method of claim 8, wherein adjusting the respective threshold voltages includes adjusting the respective threshold voltages to match the segment currents generated by the plurality of segment current sources.

11. The method of claim 8, wherein adjusting the respective threshold voltages includes independently adjusting the respective threshold voltages.

12. The method of claim 8, wherein each of the segment current sources includes a resistor, and wherein the respective threshold voltages are adjusted based at least in part on the resistors.

13. The method of claim 8, further comprising, using a plurality of current output trim DACs, receiving respective ones of the plurality of trim coefficients and generating back gate voltages based on the respective ones of the plurality of trim coefficients.

14. The method of claim 13, wherein adjusting the respective threshold voltages includes adjusting the respective threshold voltages based on the back gate voltages.

* * * * *

UNITED STATES PATENT AND TRADEMARK OFFICE
CERTIFICATE OF CORRECTION

PATENT NO. : 9,136,864 B1  
APPLICATION NO. : 14/619572  
DATED : September 15, 2015  
INVENTOR(S) : Jerzy Antoni Teterwak et al.

Page 1 of 1

It is certified that error appears in the above-identified patent and that said Letters Patent is hereby corrected as shown below:

Title Page, Column 1  
(22) Filed, Line 1   Insert --(65) Publication Data US 2015/0244390 A1 Aug. 27, 2015--

Signed and Sealed this  
Sixteenth Day of August, 2016

Michelle K. Lee  
*Director of the United States Patent and Trademark Office*